(12) United States Patent
Yabukami et al.

(10) Patent No.: US 12,163,990 B2
(45) Date of Patent: Dec. 10, 2024

(54) PERMEABILITY MEASURING PROBE AND PERMEABILITY MEASURING DEVICE

(71) Applicant: TOHOKU UNIVERSITY, Sendai (JP)

(72) Inventors: Shin Yabukami, Sendai (JP); Kazuhiko Okita, Sendai (JP)

(73) Assignee: TOHOKU UNIVERSITY (JP)

( * ) Notice: Subject to any disclaimer, the term of this patent is extended or adjusted under 35 U.S.C. 154(b) by 116 days.

(21) Appl. No.: 17/955,732

(22) Filed: Sep. 29, 2022

(65) Prior Publication Data

US 2023/0025196 A1 Jan. 26, 2023

Related U.S. Application Data

(63) Continuation of application No. PCT/JP2021/012493, filed on Mar. 25, 2021.

(30) Foreign Application Priority Data

Mar. 30, 2020 (JP) .................................. 2020-061006
Mar. 31, 2020 (JP) .................................. 2020-062596

(51) Int. Cl.
*G01R 29/08* (2006.01)

(52) U.S. Cl.
CPC ................................ *G01R 29/0878* (2013.01)

(58) Field of Classification Search
CPC ............ G01R 29/0878; G01R 33/1207; G01R 33/12; G01R 33/1223; G01R 1/06733; G01R 27/26; G01R 3/00

See application file for complete search history.

(56) References Cited

U.S. PATENT DOCUMENTS

| | | | |
|---|---|---|---|
| 7,595,650 B2 | 9/2009 | Funato et al. | |
| 2004/0021463 A1* | 2/2004 | Miyazawa | G01R 29/0878 324/539 |
| 2007/0177414 A1 | 8/2007 | Funato et al. | |

FOREIGN PATENT DOCUMENTS

| | | |
|---|---|---|
| JP | 2001324522 A | 11/2001 |
| JP | 2006170732 A | 6/2006 |
| JP | 2007187539 A | 7/2007 |
| JP | 201060367 A | 3/2010 |

(Continued)

OTHER PUBLICATIONS

English translation of KR 20080104660A (Year: 2008).*

(Continued)

*Primary Examiner* — Daniel D Chang
(74) *Attorney, Agent, or Firm* — The Webb Law Firm

(57) ABSTRACT

A probe configured to measure the magnetic permeability of a magnetic body includes a first signal conductor and a second signal conductor that form a pair of signal conductors, the first and second signal conductors being a signal transmission path, and tip ends of the first and second signal conductors being disposed away from a surface of the magnetic body by a predetermined gap length and at a predetermined interval from each other; a linear conductor that electrically connects the tip ends of the first and second signal conductors and that extends between the tip ends; and a first ground conductor and a second ground conductor that form a pair of ground conductors disposed in the vicinity of the pair of signal conductors, tip ends of the first and second ground conductor being in contact with the surface of the magnetic body.

13 Claims, 23 Drawing Sheets

(56) References Cited

FOREIGN PATENT DOCUMENTS

| | | | |
|---|---|---|---|
| JP | 201232165 A | | 2/2012 |
| JP | 2015172497 A | * | 10/2015 |
| JP | 201653569 A | | 4/2016 |
| KR | 20080104660 A | * | 12/2008 |
| KR | 1020080104660 A | | 12/2008 |
| WO | 2018175080 A1 | | 9/2018 |

OTHER PUBLICATIONS

English translation of JP-2015172497-A (Year: 2015).*
Extended European Search Report for European Patent Application No. 21780006.9 dated Aug. 11, 2023.
Calcagno et al., "Semiautomatic permeance tester for thick magnetic films", Review of Scientific Instruments, 1975, pp. 904-908, vol. 46.
Valdes, "Resistivity Measurements on Germanium for Transistors", Proceedings of the IRE, 1954, pp. 420-427, vol. 42:2.
Webb et al., "High-frequency permeability of laminated and unlaminated, narrow, thin-film magnetic stripes (invited)", Journal of Applied Physics, 1991, pp. 5611-5615, vol. 69.
Weir, "Automatic Measurement of Complex Dielectric Constant and Permeability at Microwave Frequencies", Proceedings of the IEEE, 1974, pp. 33-36, vol. 62:1.
Yabukami et al., "High Sensitivity Permeability Measurements of Striped Films Obtained by Input Impedance", IEEE Transactions on Magnetics, 2001, pp. 2776-2778, vol. 37:4.
Yamaguchi et al., "A New 1MHz-2GHz Permeance Meter for Metallic Thin Films", IEEE Transactions on Magnetics, 1997, pp. 3619-3621, vol. 33:5.
International Search Report in International Patent Application No. PCT/JP2021/012493 mailed Jun. 15, 2021.
Written Opinion of the International Searching Authority in International Patent Application No. PCT/JP2021/012493 mailed Jun. 15, 2021.

* cited by examiner

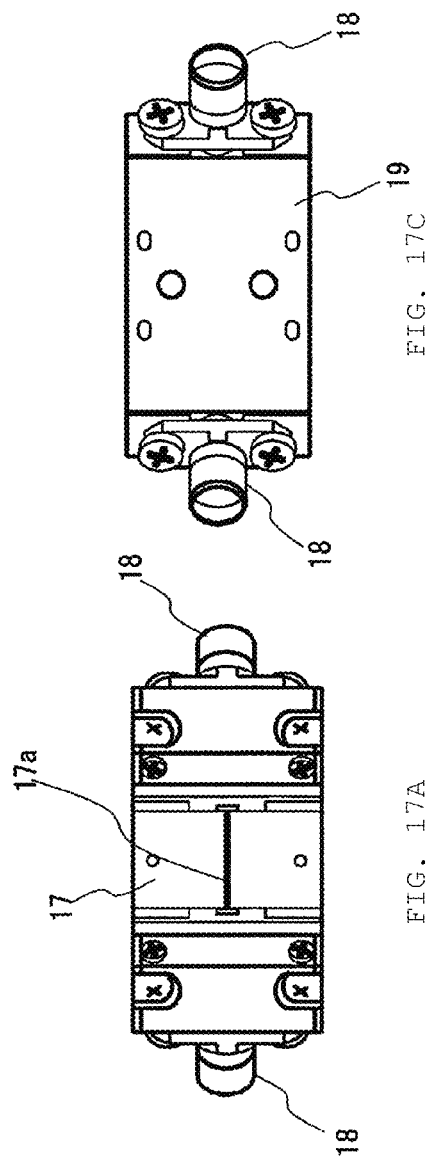
FIG. 17A
FIG. 17C
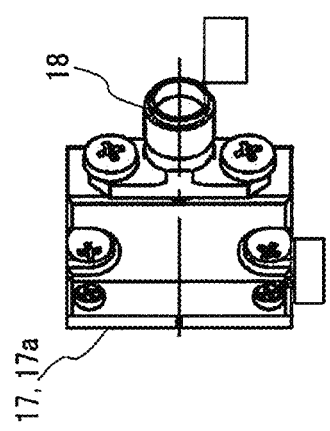
FIG. 17B
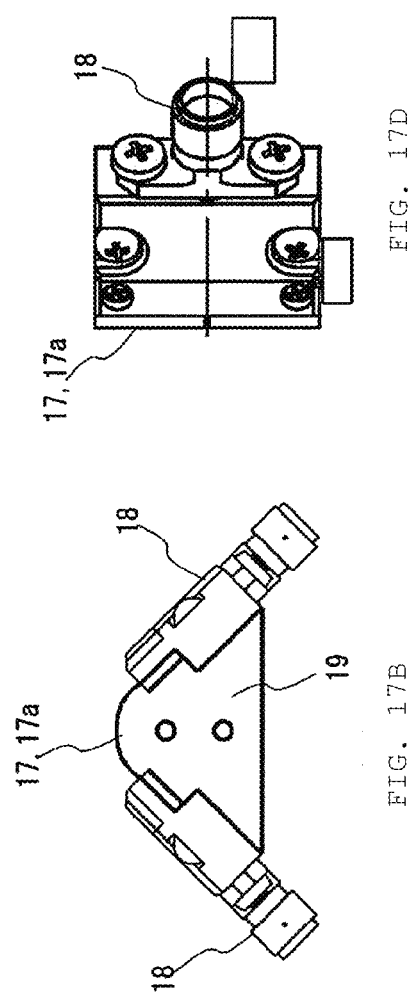
FIG. 17D

PERMEABILITY MEASURING PROBE AND PERMEABILITY MEASURING DEVICE

CROSS-REFERENCE TO RELATED APPLICATIONS

This application is a Continuation Application of International Application No. PCT/JP2021/012493, filed Mar. 25, 2021, and claims priority to Japanese Patent Application No. 2020-061006, filed Mar. 30, 2020, and Japanese Patent Application No. 2020-062596, filed Mar. 31, 2020, the disclosures of which are hereby incorporated by reference in their entirety.

BACKGROUND OF THE INVENTION

Field of the Invention

The present invention relates to a magnetic permeability measuring probe and a magnetic permeability measuring device using the same

Description of Related Art

Many methods of measuring a high frequency magnetic permeability of a magnetic body (usually, several hundred kHz to several GHz) have been proposed since the 1950s, but all of the methods result in a method using a coil (or an antenna) (see, for example, Non-Patent Literatures 1 to 3) or a method using a transmission line, a waveguide, or the like (see, for example, Non-Patent Literature 4). On the other hand, a method of measuring resistivity by bringing a short needle into contact with a material (for example, see Non-Patent Literature 5) is a widely used method, but this method is to measure the resistivity of the material, and is not to measure magnetic permeability.

The present inventors have published a paper for obtaining magnetic permeability from an impedance of a fine strip thin film having a width of about 100 μm (see, for example, Non-Patent Literature 6). Patent Literature 1 discloses a measurement method applicable to a magnetic thin film of any size, not limited to a strip. Patent Literature 2 discloses a method capable of evaluating magnetic permeability by disposing a meander-shaped probe close to a magnetic thin film. Patent Literature 3 discloses a method of measuring magnetic permeability by bringing a linear shape portion of a linear microstrip conductor formed of one linear shape portion close to a magnetic body with an insulator sandwiched therebetween.

CITATION LIST

Patent Literature

PTL 1: JP-A-2010-060367
PTL 2: JP-A-2012-032165
PTL 3: JP-A-2015-172497

Non-Patent Literature

Non-Patent Literature 1: P. A. Calcagno, D. A. Thompson, "Semiautomatic permeance tester for thick magnetic films", Rev. Sci. Instrum, 1975, 46, p. 904
Non-Patent Literature 2: B. C. Webb, M. E. Re, C. V. Jahnes and M. A. Russak, "High-frequency permeability of laminated and unlaminated, narrow thin-film magnetic stripes", J. Appl. Phys., 1991, vol 69, p. 5611-5615
Non-Patent Literature 3: M. Yamaguchi, S. Yabukami and K. I. Arai, "A New 1 MHz-2 GHz Permeance Meter For Metallic Thin Films", IEEE Trans. Magn., 1997, 33, p. 3619
Non-Patent Literature 4: H. B. Weir, "Automatic Measurement of Complex Dielectric Constant and Permeability at Microwave Frequencies", Proc IEEE, 1975, 62, p. 33
Non-Patent Literature 5: L. B. Valdes, "Resistivity measurements on germanium for transistors", Proc. IRE, 1954, p. 420-427
Non-Patent Literature 6: S. Yabukami, T. Uo, M. Yamaguchi, K. I. Arai, and M. Takezawa, "High sensitivity permeability measurements of striped films obtained by input impedance", IEEE Transactions, Magn., 2001, vol. 37, p. 2774-2778

In recent years, a magnetic device using a magnetic thin film has great marketability such as magnetic recording and an MRAM, and a film thickness of the manufactured magnetic thin film is as thin as several nm. Magnetic permeability of the magnetic thin film is the most basic parameter directly related to a performance of the magnetic device, and evaluation of the magnetic permeability of the magnetic thin film in a manufacturing line is also important from the viewpoint of improving yield of a thin film magnetic device.

As described above, evaluation of a magnetic thin film having a film thickness of about several nm is fairly important, but the film thickness is about 100 nm or more in a magnetic permeability measuring method in the related art above, and it is difficult to evaluate high frequency magnetic permeability of an ultrathin film having a film thickness of several nm. There is a technique for evaluating a high frequency magnetic characteristic such as ferromagnetic resonance, but this technique is a technique for integrally fabricating a transmission line and a magnetic thin film by a microfabrication technique and performing evaluation, and is not a general-purpose evaluation technique.

There is a need for evaluating a micron-order local magnetic characteristic (measuring magnetic permeability, damping constant, magnetostriction constant, and the like) in a thin film magnetic device represented by an MRAM and the like, and there is a restriction on a size of a probe and the like in a measuring device in the related art, and it is difficult to measure magnetic permeability.

Therefore, an object of the invention is to provide a magnetic permeability measuring probe and a magnetic permeability measuring device using the same, which can measure local magnetic permeability of a magnetic body such as a magnetic thin film particularly at a high SN ratio.

SUMMARY OF THE INVENTION

A configuration of a magnetic permeability measuring probe in the invention for achieving the above object is a probe configured to measure magnetic permeability of a magnetic body, the probe including: a first signal conductor and a second signal conductor that form a pair of signal conductors, the first signal conductor and the second signal conductor being a signal transmission path transmitting a supplied current signal; a first ground conductor and a second ground conductor that form a pair of ground conductors disposed in the vicinity of the pair of signal conductors; and a linear conductor that electrically connects tip ends of the first signal conductor and the second signal conductor or tip ends of the first ground conductor and the second ground conductor and that extends between the tip ends, in which (i) the tip ends of the first signal conductor and the second signal conductor are disposed away from a surface of the magnetic body by a predetermined gap length and at a predetermined interval from each other, the tip ends of the first ground conductor and the second ground conductor are in contact with the surface of the magnetic body, and the linear conductor electrically connects the tip ends of the first signal conductor and the second signal conductor to each other, or (ii) the tip ends of the first signal conductor and the second signal conductor are in contact with the surface of the magnetic body and are disposed at a predetermined interval from each other, the tip ends of the first ground conductor and the second ground conductor are disposed away from the surface of the magnetic body by a predetermined gap length, and the linear conductor electrically connects the tip ends of the first ground conductor and the second ground conductor to each other.

As one form example, the first signal conductor and the first ground conductor form a first coaxial line, and the second signal conductor and the second ground conductor form a second coaxial line. When the coaxial line is formed, the linear conductor has a width smaller than diameters of the first coaxial line and the second coaxial line.

As another form example, the first signal conductor and the first ground conductor form a first coplanar line, and the second signal conductor and the second ground conductor form a second coplanar line. As a further form example, the first signal conductor and the first ground conductor form a first microstrip line, and the second signal conductor and the second ground conductor form a second microstrip line. When the coplanar line or the microstrip line is formed, the linear conductor has a width equal to or smaller than a width of the first signal conductor and the second signal conductor. The linear conductor is in parallel to the surface of the magnetic body and away from the surface of the magnetic body by the gap length.

Another configuration of the magnetic permeability measuring probe in the invention is a probe configured to measure magnetic permeability of a magnetic body, the probe including: a microstrip line that is a portion in contact with the magnetic body and that is formed by sandwiching a dielectric between a microstrip conductor and a ground conductor; connectors each connected to a respective one of both ends of the microstrip line; and a body that holds the microstrip line and the connectors, in which the body has a convex curved portion on a top portion of the body, and the microstrip line is curved along the convex curved portion straddling the top portion of the body.

As one form example, a flat portion is provided at a top portion of the convex curved portion of the body, and a portion of the microstrip line along the flat portion is linearly disposed.

As another form example, the connectors are attached to side surfaces extending downward from the top portion of the body.

A magnetic permeability measuring device according to the invention includes: the probe having any one of the above configurations; a magnetic field applying portion configured to apply a magnetic field to the magnetic body; a signal measuring instrument that is connected to the probe via a cable and that is configured to measure a signal of a transmission coefficient both presence and absence of magnetic field application by the magnetic field applying portion; and a processing unit configured to obtain, based on the signal of the transmission coefficient measured by the signal measuring instrument, magnetic permeability of the magnetic body by numerical analysis calculation processing.

According to the magnetic permeability measuring probe and the magnetic permeability measuring device using the same in the invention, deterioration of a characteristic impedance is prevented, and the magnetic permeability can be measured with a high SN ratio and a broad band. In particular, magnetic permeability of a magnetic thin film in a magnetic device such as an MRAM can be evaluated with high accuracy.

BRIEF DESCRIPTION OF DRAWINGS

FIG. 17A through FIG. 17D are diagrams showing the fifth configuration example of the probe 10 according to the embodiment of the invention.

DESCRIPTION OF THE INVENTION

Hereinafter, an embodiment of the invention will be described with reference to the drawings. However, such an example of the embodiment does not limit the technical scope of the invention.

Figure 1:
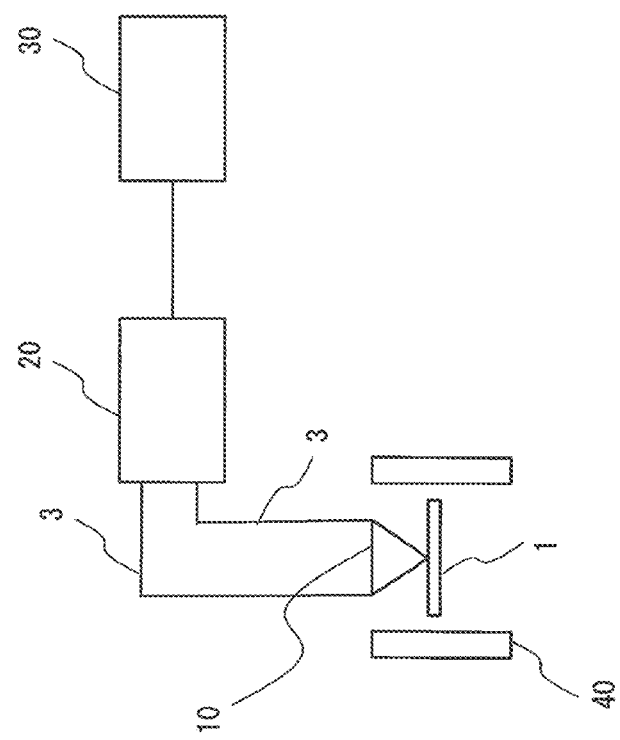
FIG. 1 is a diagram showing a schematic configuration example of a magnetic permeability measuring device according to an embodiment of the invention.

FIG. 1 is a diagram showing a schematic configuration example of a magnetic permeability measuring device according to an embodiment of the invention. A magnetic permeability measuring device according to the embodiment of the invention includes a probe 10, a network analyzer 20 (signal measuring instrument), and a calculation processing device (for example, a computer device such as a personal computer) 30 (processing unit) that executes numerical analysis processing.

The probe 10 is disposed in contact with or in proximity to a magnetic body 1 as a sample, and is connected to the network analyzer 20 via a signal cable 3. The network analyzer 20 is a current supply source capable of supplying a current signal, and measures the transmission coefficient ($S_{21}$) of the magnetic body 1 to be evaluated by the network analyzer 20, takes signal data thereof into the control personal computer 30, and obtains complex magnetic permeability of a magnetic body by predetermined numerical analysis processing (for example, optimization processing). In order to magnetically saturate the magnetic body 1, a magnet (magnetic field applying portion) formed of a Helmholtz coil (electromagnetic coil) is used.

Figure 2:
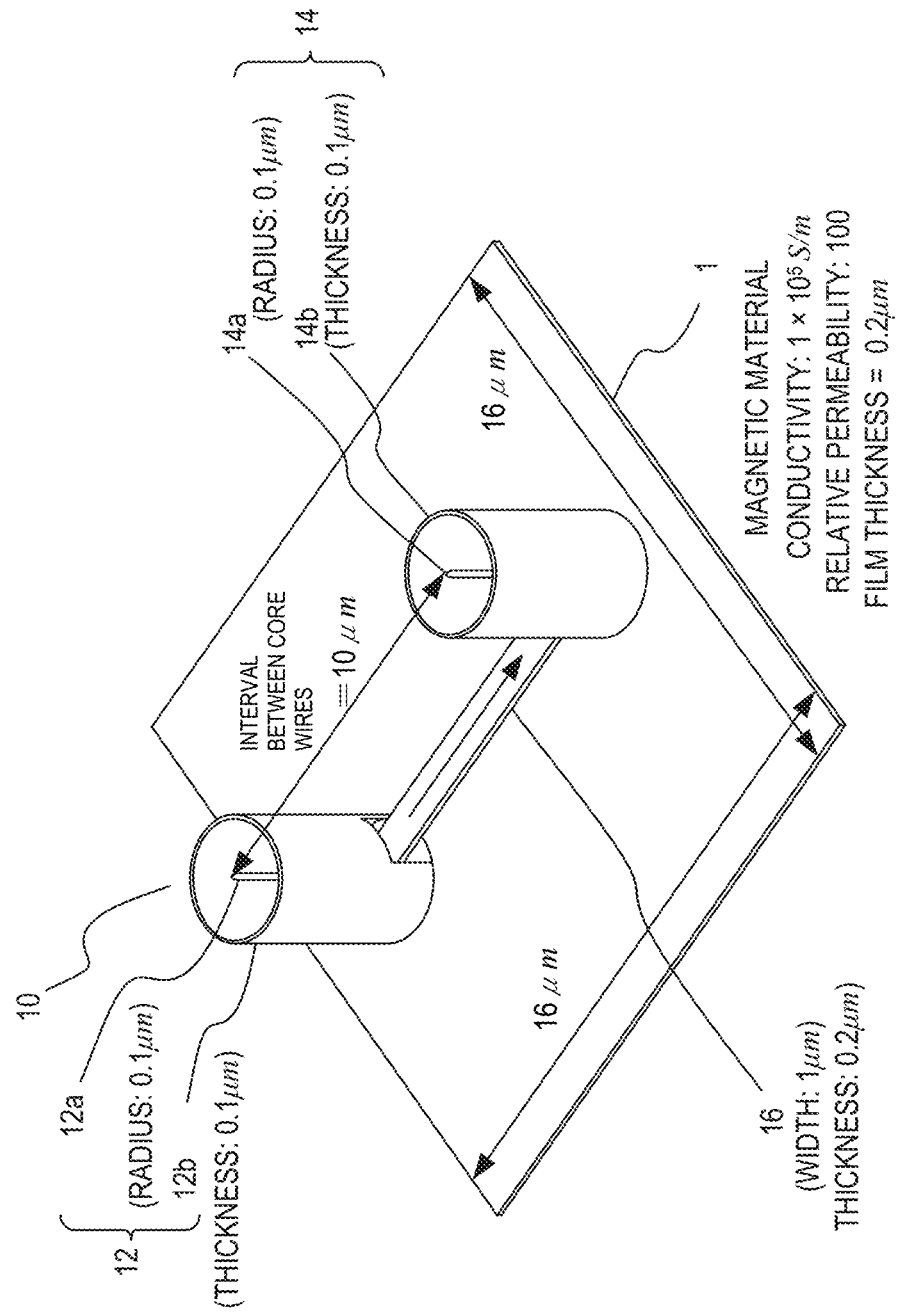
FIG. 2 is a perspective view showing a first configuration example of a probe 10 according to the embodiment of the invention.
Figure 3:
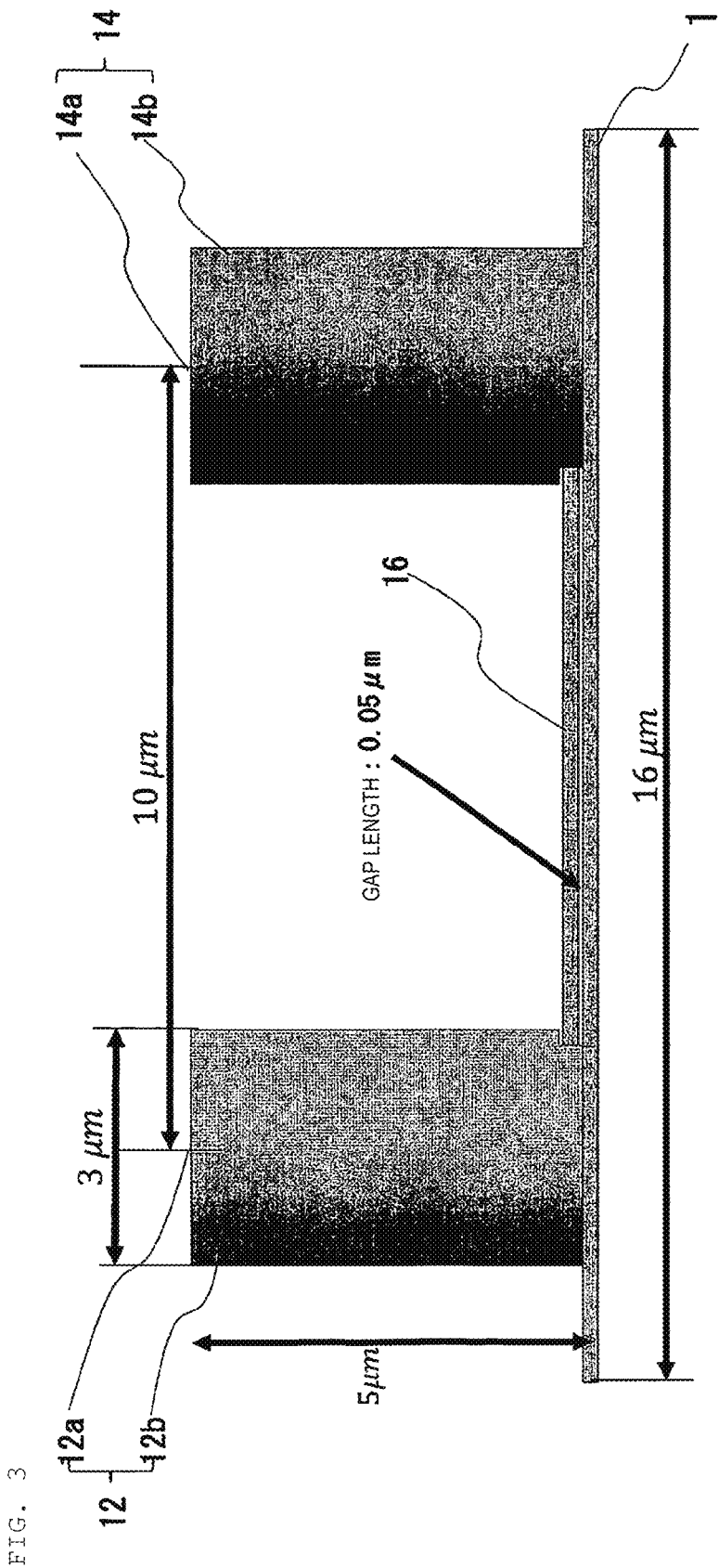
FIG. 3 is a front view showing the first configuration example of the probe 10 according to the embodiment of the invention.
Figure 4:
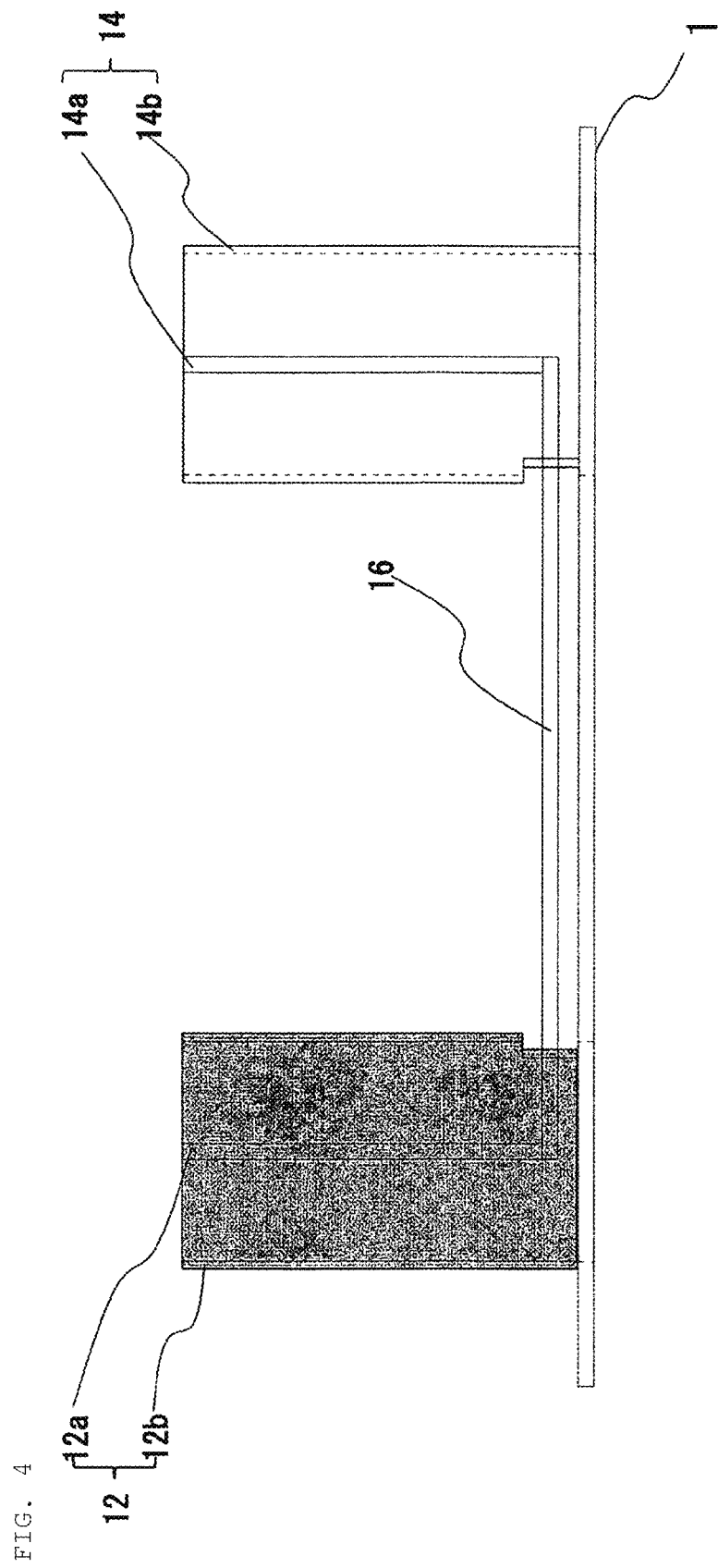
FIG. 4 is a diagram showing an internal configuration of the first configuration example of the probe 10 according to the embodiment of the invention.

FIG. 2 is a perspective view showing a first configuration example of the probe 10 according to the embodiment of the invention. FIG. 3 is a front view of the first configuration example. FIG. 4 is a front view showing an internal configuration of the first configuration example. The probe 10 includes a pair of transmission conductors 12 and 14 and a linear conductor 16 connecting signal conductors of the transmission conductors. Dimensions shown in FIGS. 2 and 3 are data used in a simulation experiment to be described later.

The transmission conductors 12 and 14 are coaxial lines, the transmission conductor 12 includes a signal conductor 12a (first signal conductor) which is a core wire and a ground conductor 12b (first ground conductor) which is an outer conductor disposed around (in the vicinity of) the signal conductor 12a via a dielectric layer, and the transmission conductor 14 includes a signal conductor 14a (second signal conductor) which is a core wire and a ground conductor 14b (second ground conductor) which is an outer conductor disposed around (in the vicinity of) the signal conductor 14a via a dielectric layer. The transmission conductors 12 and 14 are disposed at a predetermined interval in a width direction. Tip ends of the signal conductors 12a and 14a are disposed with a predetermined gap away from a surface of the magnetic body 1 as the sample. Tip ends of the ground conductors 12b and 14b are in contact with the surface of the magnetic body 1 to be evaluated.

The linear conductor 16 is an elongated strip line extending between the tip ends in a manner of connecting the tip ends of the signal conductors 12a and 14a. The linear conductor 16 also extends parallel to the surface of the magnetic body 1 with a predetermined gap length from the surface of the magnetic body 1. The linear conductor 16 is formed with a width smaller than that of the ground conductors 12b and 14b forming the outer conductor of the coaxial line so as to prevent spread of a current in the magnetic body 1. As shown, in order to connect the tip ends of the signal conductors 12a and 14a, which are core wires, to each other, the ground conductors 12b and 14b around the signal conductors 12a and 14a are processed in a manner of not being in contact with the linear conductor 16. The linear conductor 16 may be formed of, for example, a copper wire, a copper foil, or the like.

The transmission conductors 12 and 14 are connected to the signal cable (for example, coaxial cable) 3 via a connector (not shown) on the other end side, and are connected to the network analyzer 20. A current signal supplied from the network analyzer 20 is transmitted through the signal conductors 12a and 14a and the linear conductor 16. The transmission conductors 12 and 14 and the linear conductor 16 that constitute the probe 10 are integrally formed using an existing film processing technique such as vapor deposition.

Figure 5:
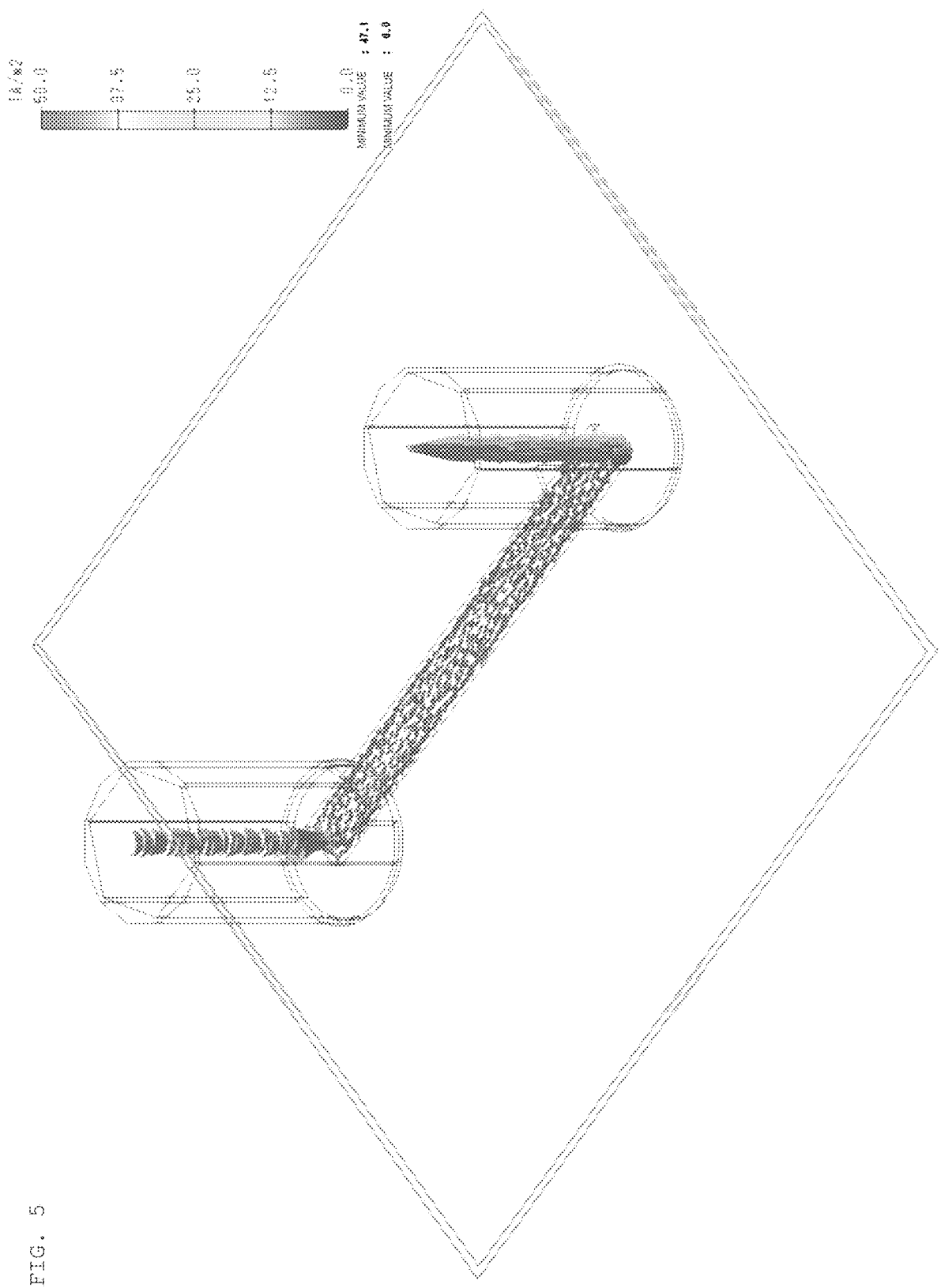
FIG. 5 is a simulation diagram of a current density and distribution flowing through the probe 10.
Figure 6:
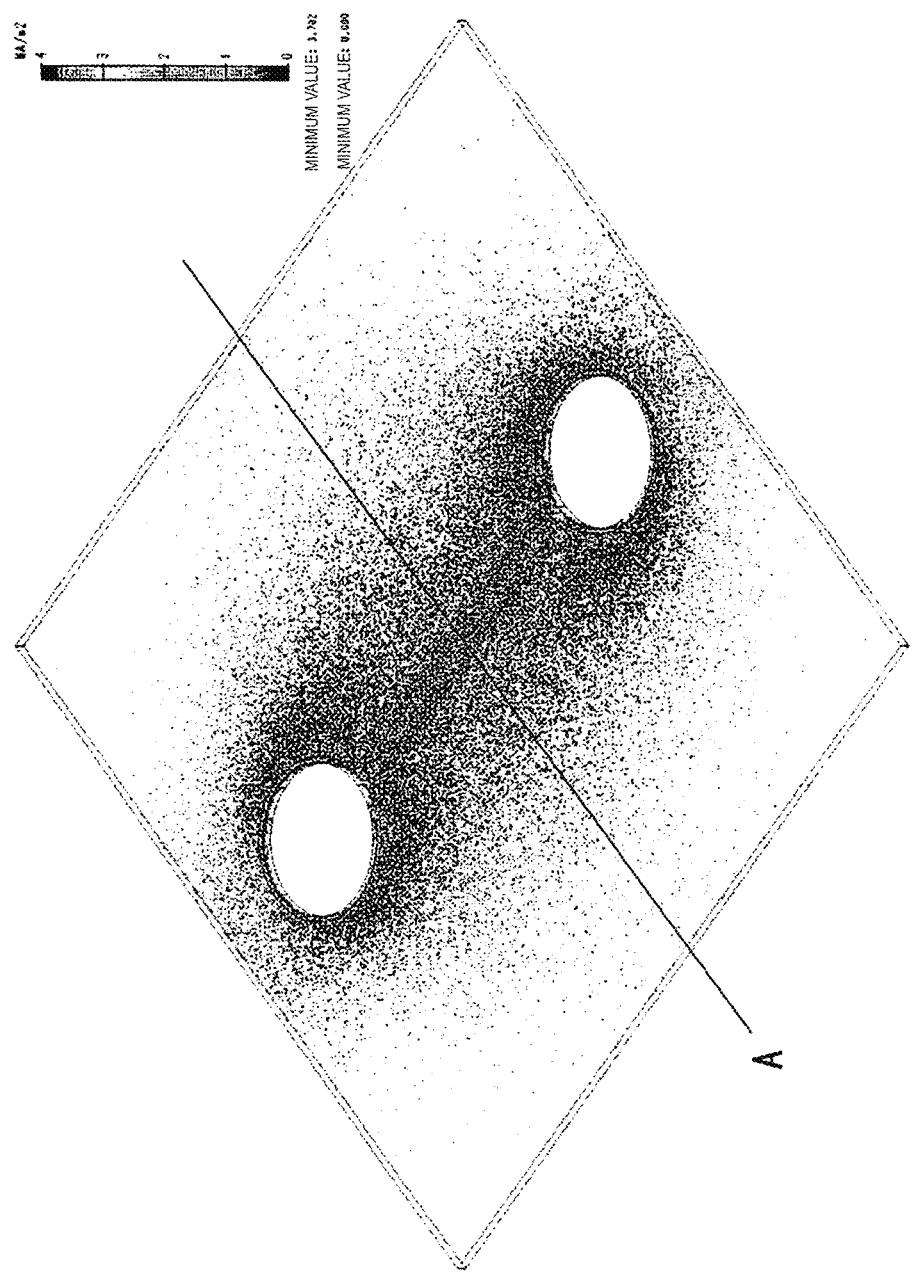
FIG. 6 is a simulation diagram of a current density and distribution flowing through a magnetic body 1.

FIGS. 5 and 6 are diagrams showing simulation results of current densities and distributions flowing through the probe 10 and the magnetic body 1. FIG. 5 shows a density and distribution of a high frequency current (for example, about 1 GHz) flowing from the signal conductor 12a to the signal conductor 14a via the linear conductor 16. FIG. 6 shows a current density and distribution of an eddy current flowing through the magnetic body 1 due to the high frequency current. In the magnetic body 1 as the sample, a large current flows in a narrow range along the linear conductor 16, and a result is obtained that the spread of the current in the magnetic body 1 is prevented. This is because the high frequency current flowing in the magnetic body 1 as the sample is collected directly below the linear conductor 16, so that a difference between a current distribution and an impedance at the time of calibration by applying a strong magnetic field is increased, and an SN ratio when magnetic permeability is acquired is improved.

Figure 7:
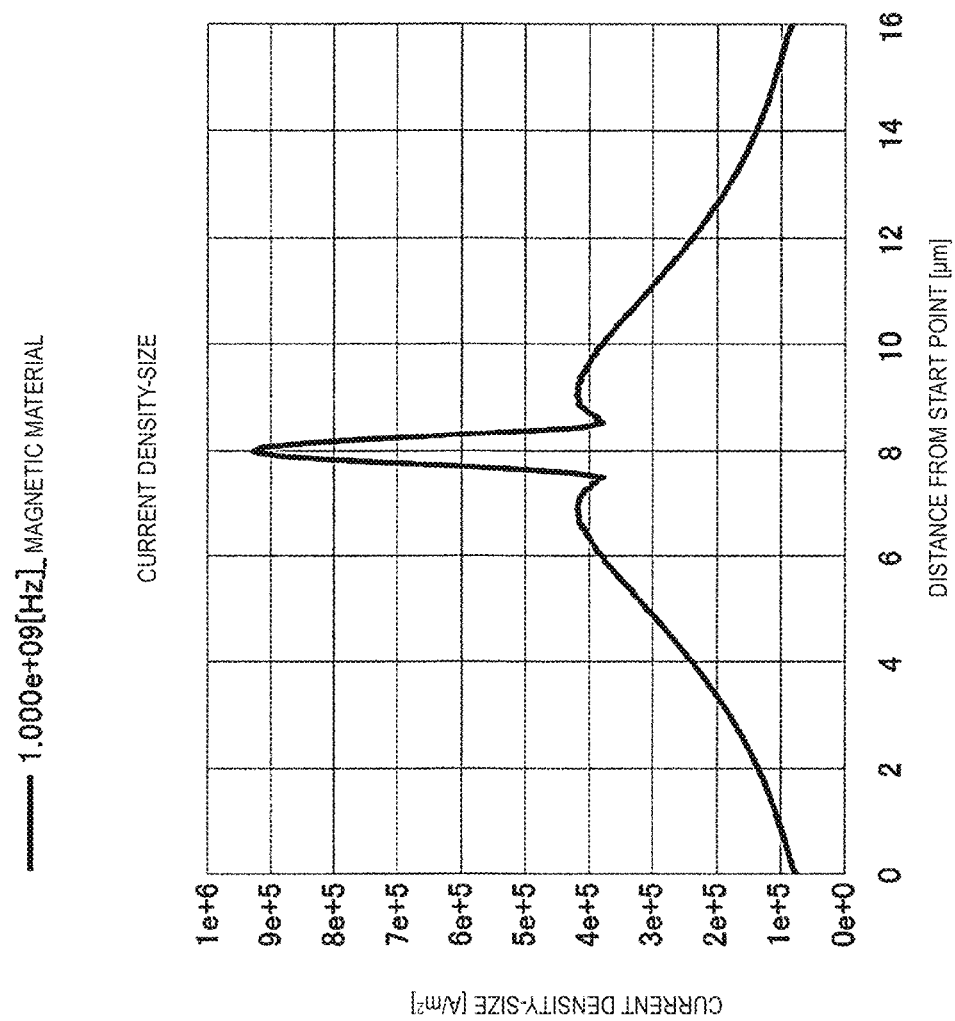
FIG. 7 is a graph showing a current density of a line A shown in FIG. 6.

FIG. 7 is a graph showing a current density on the surface of the magnetic body 1 on a line A (a center line between the transmission conductors) shown in FIG. 6, and shows a current distribution having a high sharp peak indicating that a large current flows in a thin and narrow range along the linear conductor 16 between the transmission conductors. Accordingly, the spread of the current in the magnetic body 1 is significantly prevented. According to the probe 10 in the invention, the current can be concentrated on a local portion of the magnetic body 1, spread of the current in the magnetic body 1 and reduction of an impedance due to the spread of the current are prevented, and a characteristic impedance is matched to around 50Ω, so that multiple reflections are prevented, a high SN ratio is obtained, and broadband measurement can be performed.

Figure 8:
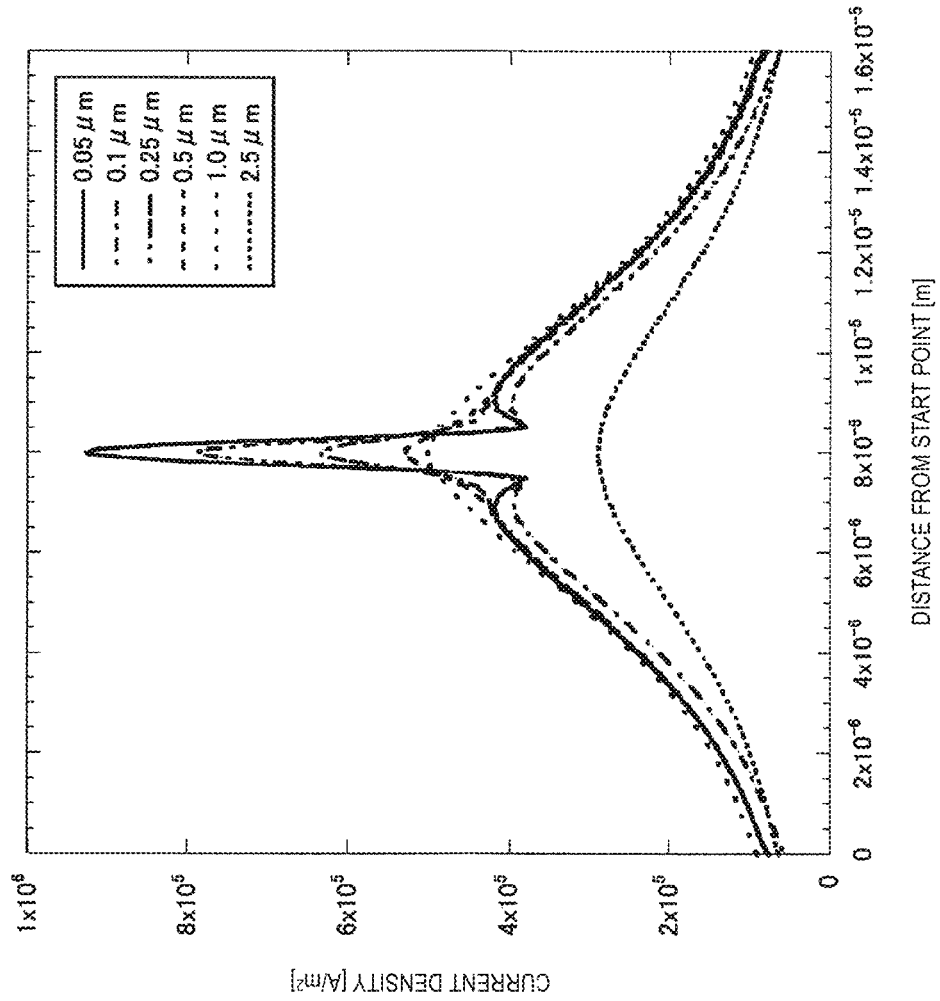
FIG. 8 is a graph showing a simulation result of a current density when gap lengths between a linear conductor 16 and the magnetic body 1 are different in the first configuration example.

FIG. 8 is a graph showing a simulation result of a current density when gap lengths between the linear conductor 16 and the magnetic body 1 are different in the first configuration example. The narrower the gap length between the linear conductor 16 and the magnetic body 1, the higher an effect of increasing a current density in a region where the linear conductor 16 extends. Even with a slightly widened configuration, the current can be collected in a narrow range along the linear conductor 16, and the spread of the current in the magnetic body 1 is effectively prevented.

Figure 9:
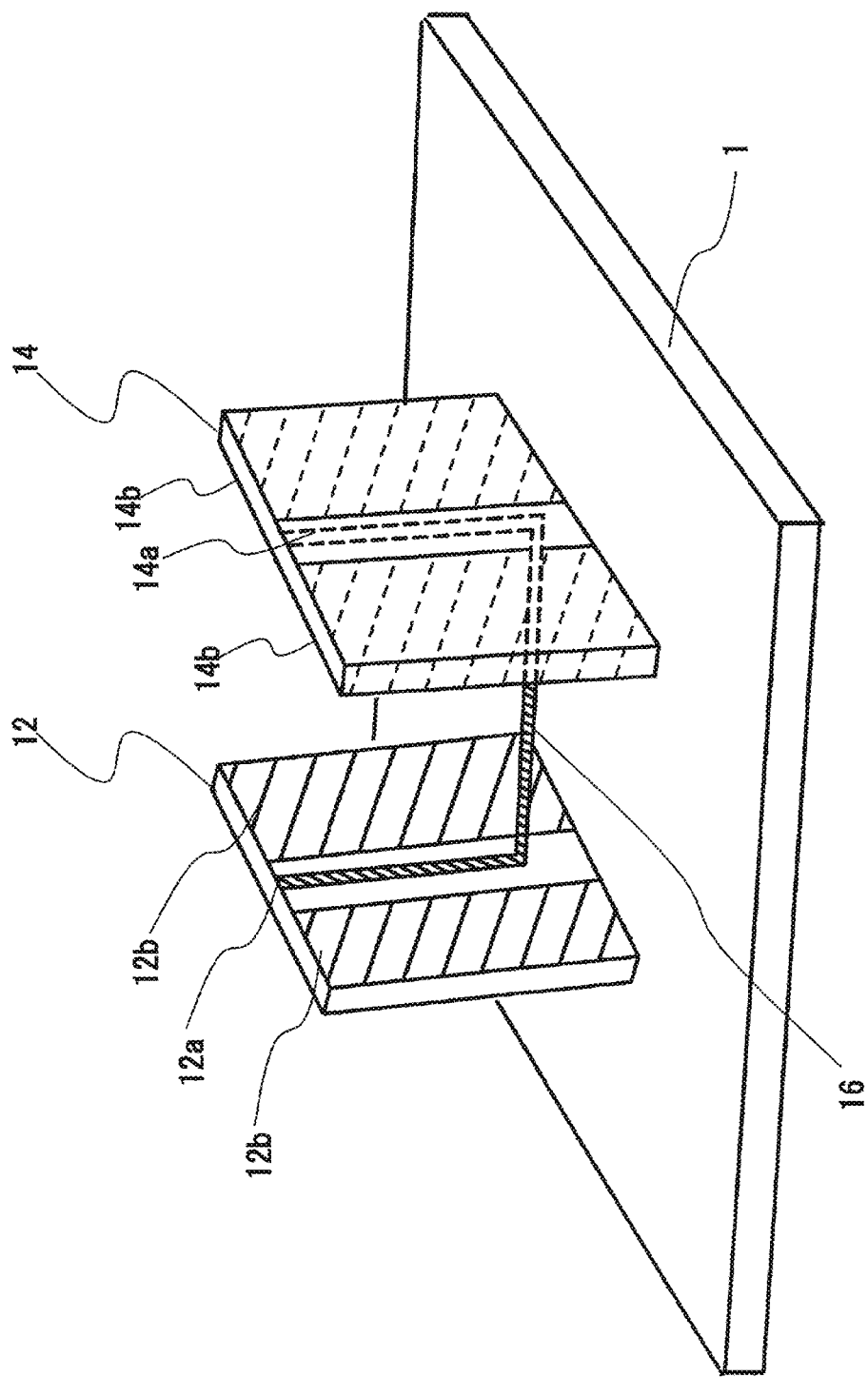
FIG. 9 is a perspective view showing a second configuration example of the probe 10 according to the embodiment of the invention.

FIG. 9 is a perspective view showing a second configuration example of the probe 10 according to the embodiment of the invention. In the second configuration example, the transmission conductors 12 and 14 are formed with coplanar lines as compared with the first configuration example. In the transmission conductors 12 and 14, the ground conductors 12b and 14b are formed on both sides of the signal conductors 12a and 14a disposed on opposing surfaces of a pair of dielectric substrates. The tip ends of the signal conductors 12a and 14a are not in contact with but close to the magnetic body 1. The tip ends of the ground conductors 12b and 14b are in contact with the surface of the magnetic body 1 to be evaluated. The linear conductor 16 extends between the tip ends of the signal conductors 12a and 14a and connects the tip ends of the signal conductors 12a and 14a. The linear conductor 16 has a width equal to or smaller than a width of the signal conductors 12a and 14a so as to prevent the spread of the current in the magnetic body 1.

Although not shown, in the first configuration example or the second configuration example, the transmission conductors 12 and 14 may be formed with microstrip lines. Also in this case, the linear conductor 16 has the width equal to or smaller than the width of the signal conductors 12a and 14a so as to prevent the spread of the current in the magnetic body 1.

Figure 10:
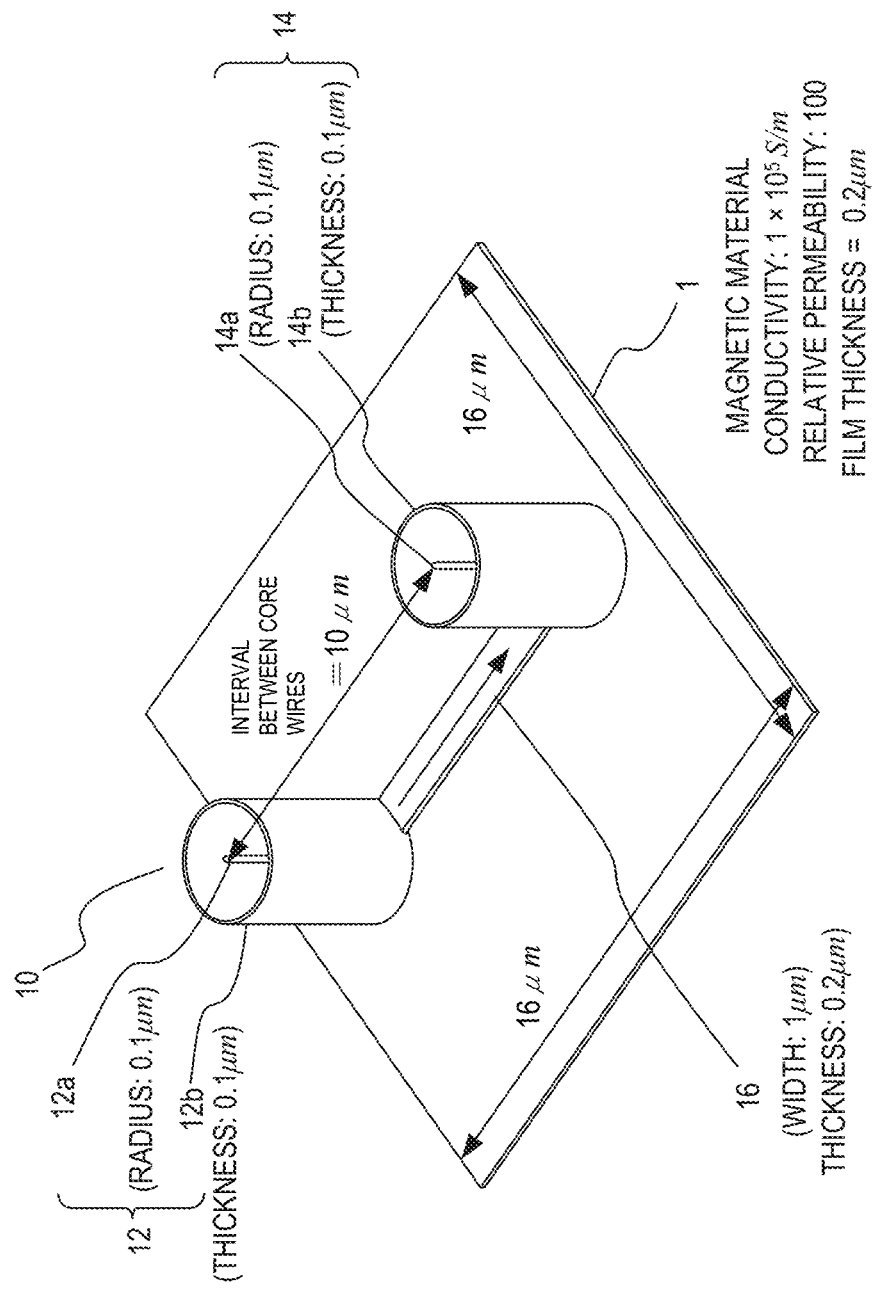
FIG. 10 is a perspective view showing a third configuration example of the probe 10 according to the embodiment of the invention.
Figure 11:
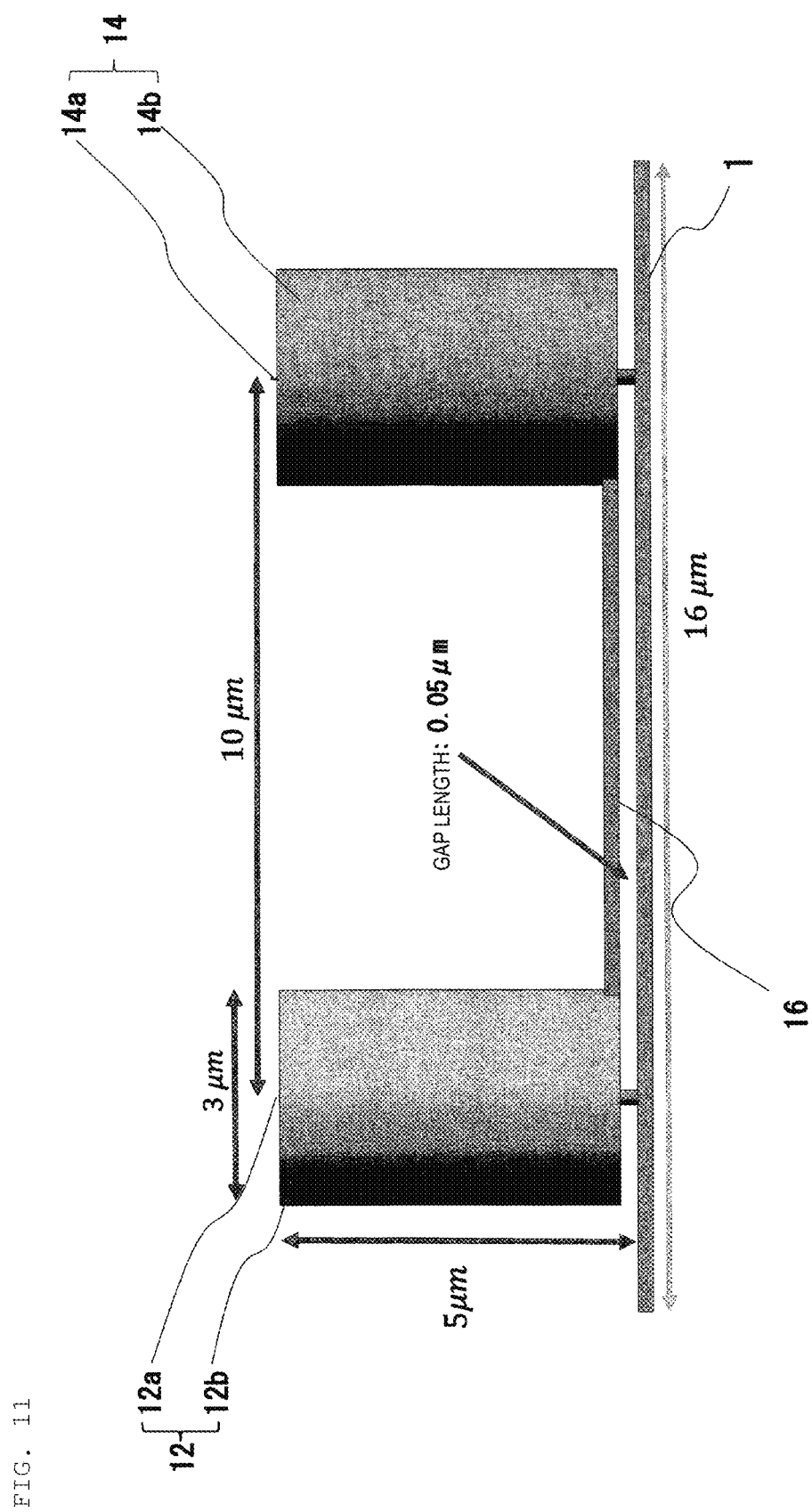
FIG. 11 is a front view showing the third configuration example of the probe 10 according to the embodiment of the invention.

FIG. 10 is a perspective view showing a third configuration example of the probe 10 according to the embodiment of the invention. FIG. 11 is a front view of the third configuration example. Similarly to the first configuration example and the second configuration example, the probe 10 includes the pair of transmission conductors 12 and 14 and the linear conductor 16 connecting signal conductors of the transmission conductors. Numerical values of dimensions and the like shown in FIGS. 10 and 11 are data used in a simulation experiment to be described later.

In the third configuration example, as compared with the first configuration example, in the transmission conductors 12 and 14 disposed at a predetermined interval in the width direction, the tip ends of the ground conductors 12b and 14b are disposed away from the surface of the magnetic body 1 as the sample by a predetermined gap length, and the tip ends of the signal conductors 12a and 14a are in contact with the surface of the magnetic body 1 to be evaluated. The linear conductor 16 is an elongated strip line extending between the tip ends in a manner of connecting the tip ends of the ground conductors 12b and 14b. The linear conductor 16 also extends parallel to the surface of the magnetic body 1 and away from the surface of the magnetic body 1 by a predetermined gap length. The linear conductor 16 is formed with a width smaller than that of the ground conductors 12b and 14b forming the outer conductor of the coaxial line so as to prevent the spread of the current in the magnetic body 1.

Figure 12:
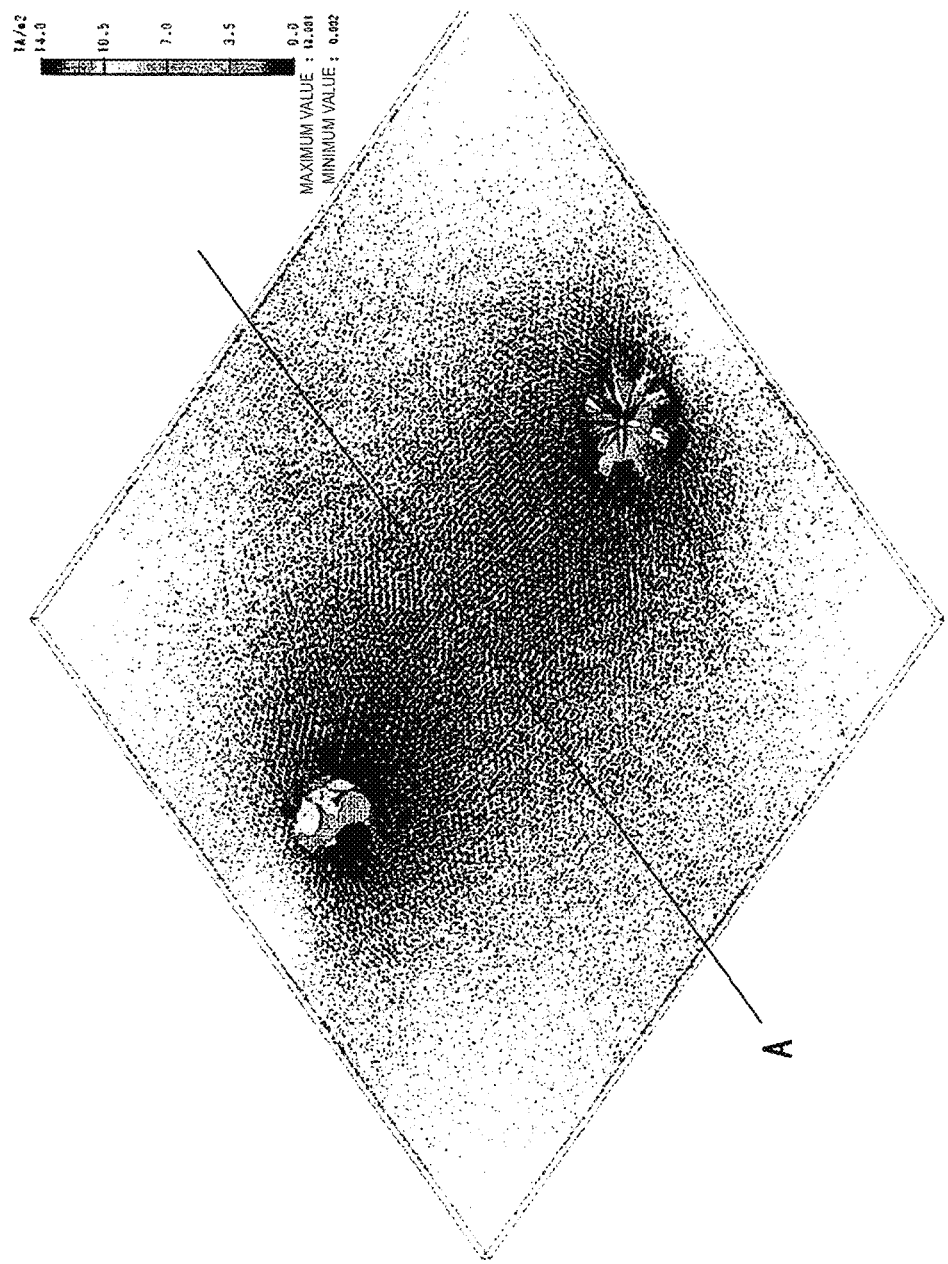
FIG. 12 is a simulation diagram of current densities and distributions flowing through the probe 10 and the magnetic body 1.
Figure 13:
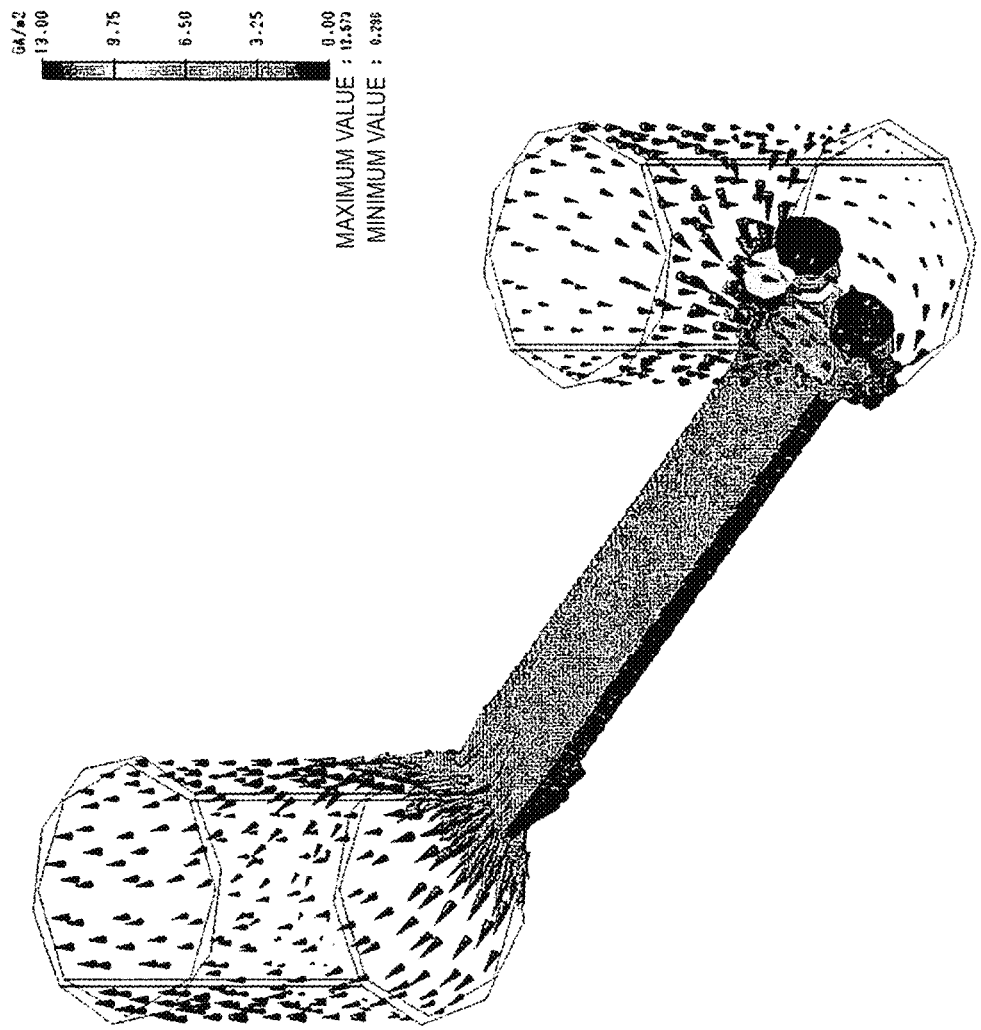
FIG. 13 is a simulation diagram of a current density and distribution flowing through the magnetic body 1.

FIGS. 12 and 13 are simulation diagrams showing simulation results of current densities and distributions flowing through the probe 10 and the magnetic body 1. FIG. 12 shows the current density and distribution in a plane of the magnetic body 1 of a high frequency current (for example, about 1 GHz) flowing between the signal conductors 12a and 14a in contact with the magnetic body 1. FIG. 13 shows the current density and distribution of an eddy current flowing to the linear conductor 16 due to a high frequency current and the ground conductors 12b and 14b. In the magnetic body 1, a relatively large current flows in the vicinity along the linear conductor 16, and a result is obtained that the spread of the current in the magnetic body 1 is prevented.

Figure 14:
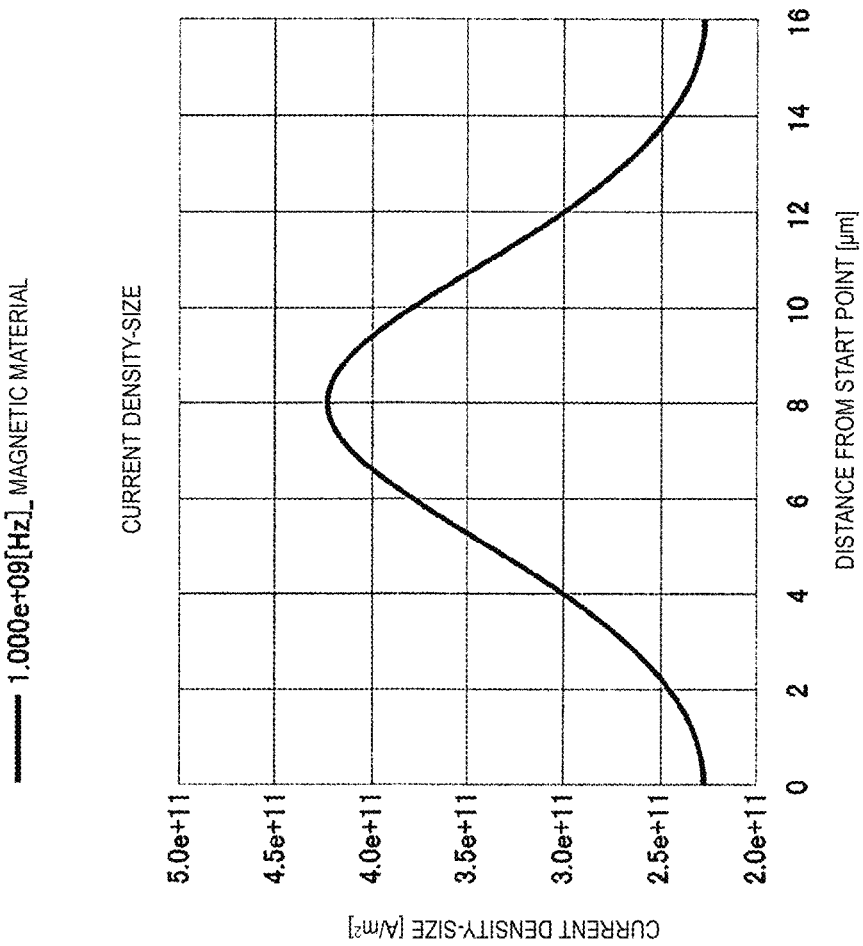
FIG. 14 is a graph showing a current density of the line A shown in FIG. 13.

FIG. 14 is a graph showing a current density on the surface of the magnetic body 1 on the line A (the center line between the transmission conductors) shown in FIG. 13, and shows a current distribution having a high peak indicating that a large current flows in a small and narrow range between the transmission conductors. When the current spreads in the plane of the magnetic body 1, the impedance reduces, and the SN ratio deteriorates due to the reduction of the impedance. However, according to the probe 10 in the invention, since the spread of the current in the magnetic body 1 and the reduction of the impedance due to the spread of the current are prevented, the current can be concentrated on a local portion of the magnetic body 1, and the characteristic impedance is matched to around 50Ω. Therefore, multiple reflections are prevented, a high SN ratio is obtained, and the broadband measurement can be performed.

Figure 15:
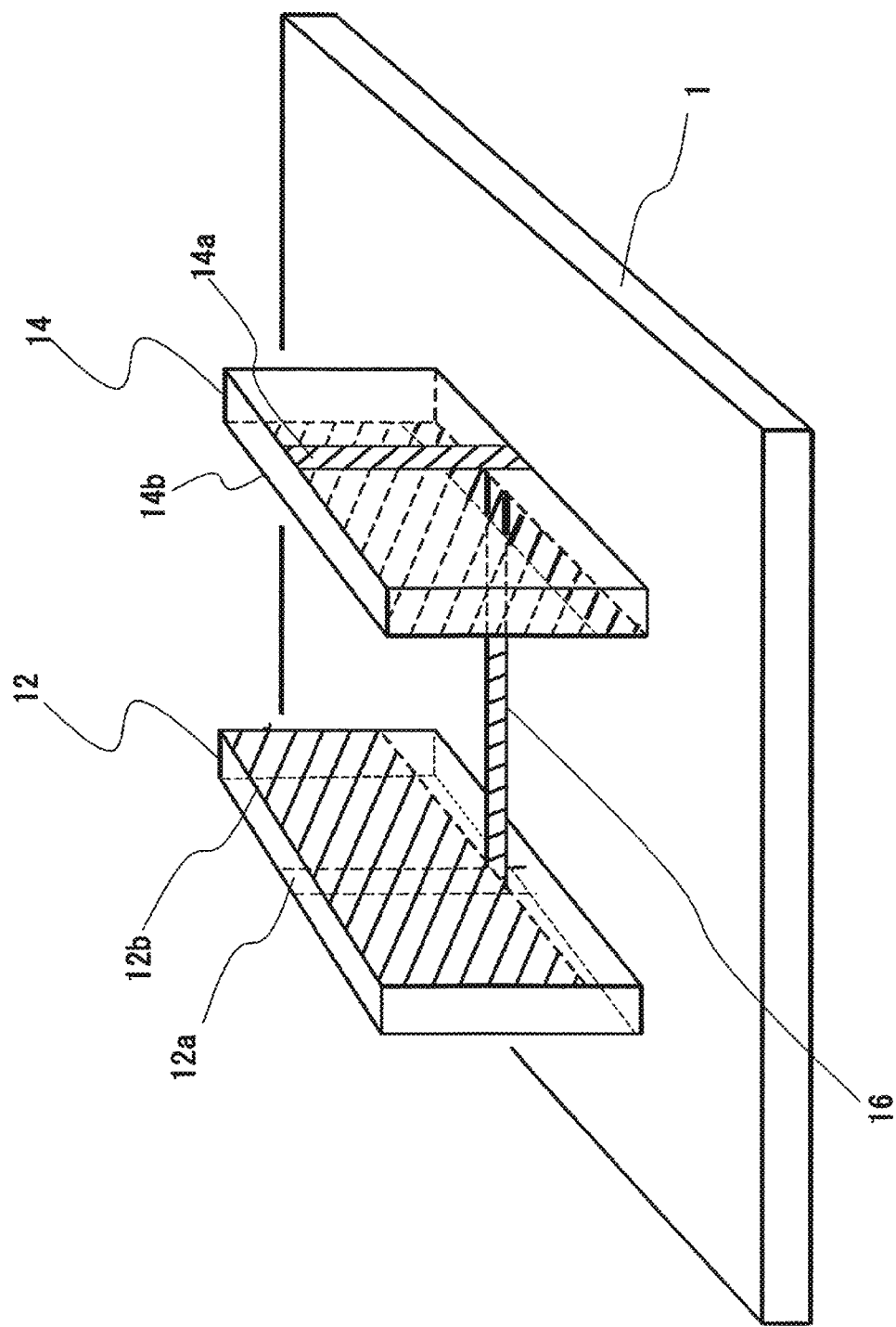
FIG. 15 is a perspective view showing a fourth configuration example of the probe 10 according to the embodiment of the invention.

FIG. 15 is a perspective view showing a fourth configuration example of the probe 10 according to the embodiment of the invention. In the fourth configuration example, the transmission conductors 12 and 14 are formed with the microstrip lines as compared with the third configuration example.

In the transmission conductors 12 and 14, the opposing surfaces of the pair of dielectric substrates are ground conductor surfaces, the ground conductors 12b and 14b are formed on the ground conductor surfaces, and the signal conductors 12a and 14a are formed on surfaces opposite to the ground conductor surfaces. The signal conductors 12a and 14a extend such that the tip ends of the signal conductors 12a and 14a are in contact with the magnetic body 1. The tip ends of the ground conductors 12b and 14b are disposed with a predetermined gap away from the surface of the magnetic body 1 as the sample. The linear conductor 16 is an elongated strip line extending between the tip ends in a manner of connecting the tip ends of the ground conductors 12b and 14b. The linear conductor 16 also extends parallel to the surface of the magnetic body 1 with a predetermined gap length from the surface of the magnetic body 1. The linear conductor 16 has a width equal to or smaller than a width of the signal conductors 12a and 14a so as to prevent the spread of the current in the magnetic body 1.

Although not shown, in the third configuration example or the fourth configuration example, the transmission conductors 12 and 14 may be formed with coplanar lines. Also in this case, the linear conductor 16 has the width equal to or smaller than the width of the signal conductors 12a and 14a so as to prevent the spread of the current in the magnetic body 1.

The signal conductors or the ground conductors in the pair of transmission conductors constituting the probe 10 are brought into electrical contact with a magnetic body to be measured, and the remaining ones of the signal conductors and the ground conductors are disposed close to without being in contact with the magnetic body and are electrically connected to each other with a linear conductor. Due to a current flowing through the linear conductor, a current flowing through the sample does not spread in the sample, and a current density in a local portion near the linear conductor significantly protrudes and increases. Accordingly, a local magnetic permeability can be measured with a high SN ratio.

For example, in a magnetic device such as a magnetoresistive random access memory (MRAM), a film thickness of a manufactured magnetic thin film is as thin as several nm. Magnetic permeability of the magnetic thin film is the most basic parameter directly linked to a performance of the magnetic device, and an evaluation of the magnetic permeability of the magnetic thin film in a manufacturing line is extremely important to improve yield of thin-film magnetic devices. The probe according to the embodiment of the invention is capable of measuring micron-order local magnetic permeability in a magnetic thin film having an ultrathin film thickness with high accuracy.

Figure 16:
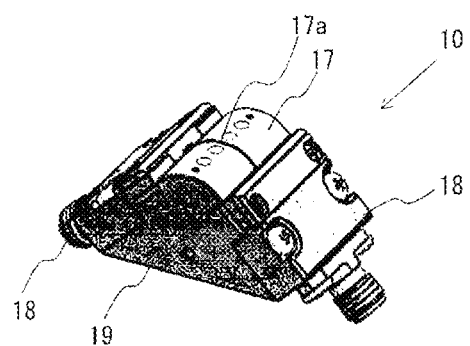
FIG. 16 is a diagram showing a fifth configuration example of the probe 10 according to the embodiment of the invention.
Figure 18:
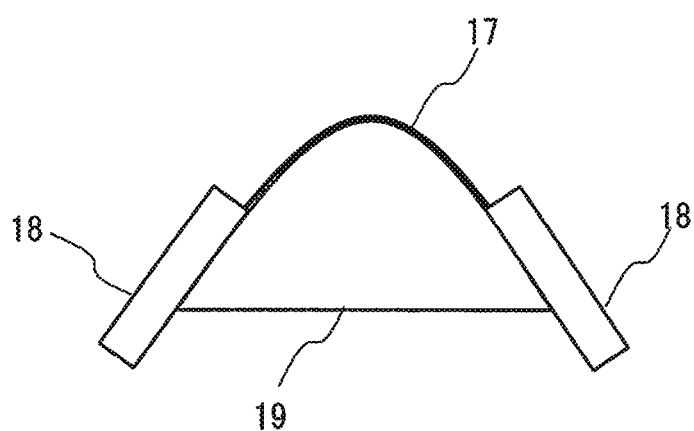
FIG. 18 is a schematic diagram showing a structure of the probe 10 in the fifth configuration example.
Figure 19:
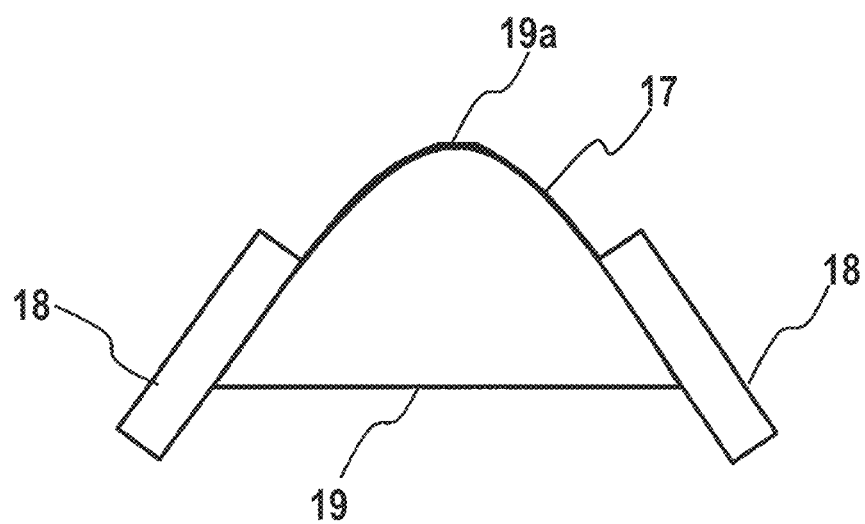
FIG. 19 is a schematic diagram showing a modification of the structure of the probe 10 in the fifth configuration example.

FIGS. 16 and 17A-D are diagrams showing a fifth configuration example of the probe 10 according to the embodiment of the invention, in which FIG. 16 is a perspective view showing an entire configuration of the probe 10, FIG. 17A is a top view, FIG. 17B is a front view, FIG. 17C is a bottom view, and FIG. 17D is a side view. FIG. 18 is a schematic diagram showing a structure of the probe 10 in the fifth configuration example. FIG. 19 is a schematic diagram showing a modification of the structure of the probe 10 in the fifth configuration example.

The probe 10 includes a microstrip line 17 having a dielectric sandwiched between a microstrip conductor 17a and a ground conductor, and connectors 18 connecting both ends of the microstrip line 17. A 50Ω coaxial cable 3 is connected to the connector 18 and is connected to the network analyzer 20. The microstrip line 17 is manufactured by etching a printed circuit board made of, for example, fluorine resin (for example, polytetrafluoroethylene (PTFE)).

The probe 10 further includes a body 19 that holds the microstrip line 17 and the connectors 18 at predetermined positions. The body 19 is formed of a metal such as phosphor bronze or brass, and has a substantially triangular front shape. A convex curved portion is formed on a top portion of the body 19, and the microstrip line 17 is curved along the convex curved portion in a manner of straddling the top portion of the body 19. The connectors 18 are attached along both inclined surfaces extending downward from the top portion of the body 19. Preferably, the connectors 18 hold the microstrip line 17 disposed in a curved manner at an opening angle of about 90 degrees. Therefore, oblique sides sandwiching the top portion of the body 19 have an opening angle of 90 degrees, and the connectors 18 on both sides are disposed on the body 19 with that angle. By setting the opening angle of two connectors 18 to about 90 degrees, the probe 10 can be disposed in close proximity without being restricted by a size of the magnetic body, and by forming the microstrip line 17 in a curved shape without a bent portion, deterioration of the characteristic impedance can be minimized, and the broadband measurement can be performed. In the probe according to the present embodiment, a frequency range up to 40 GHz, which is measurable in the related art, can be broadened to a high frequency band up to about 67 GHz.

The opening angle of the connectors 18 is not limited to the angle of about 90 degrees described above, and can be appropriately determined in an obtuse angle direction within an angle range that falls within a size of the probe 10 that can be disposed between coil intervals of a Helmholtz coil, and in an acute angle direction within an angle range that does not cause impedance mismatch.

A head portion of the probe 10 is reduced in size, and local magnetic permeability can be measured with a high SN ratio by measuring the magnetic permeability by bringing the probe into direct contact with a local portion of the magnetic body to be evaluated. In particular, in the present probe having the ground conductor, a high SN ratio can be obtained even in a micron-order local portion by a method of directly applying a high frequency current to the magnetic thin film.

As described above, for a thin film magnetic device such as a magnetoresistive random access memory (MRAM), the probe according to the embodiment of the invention can measure micron-order local magnetic permeability in a magnetic thin film having ultrathin film thickness with high accuracy.

As the modification of the structure of the probe 10 in the fifth configuration example, as shown in FIG. 19, a flat portion 19a is provided at a tip end of the convex curved portion in the top portion of the body 19, and a portion of the microstrip line 17 along the flat portion 19a is linearly disposed. For example, an entire length of the microstrip line 17 is about 16 mm, and a width of the flat portion 19a is about 1 mm to 2 mm. A thickness of the probe 10 orthogonal to the length of the microstrip line 17 is about 20 mm. Shapes of the flat portion and a curved portion are designed in a manner of being continuously connected to each other so as not to form a bent portion (or a step portion or a corner portion). By providing the flat portion, it is possible to reliably and easily bring the probe 10 into contact with a desired position of the magnetic body at the time of measurement, and it is possible to perform measurement efficiently.

Figure 20:
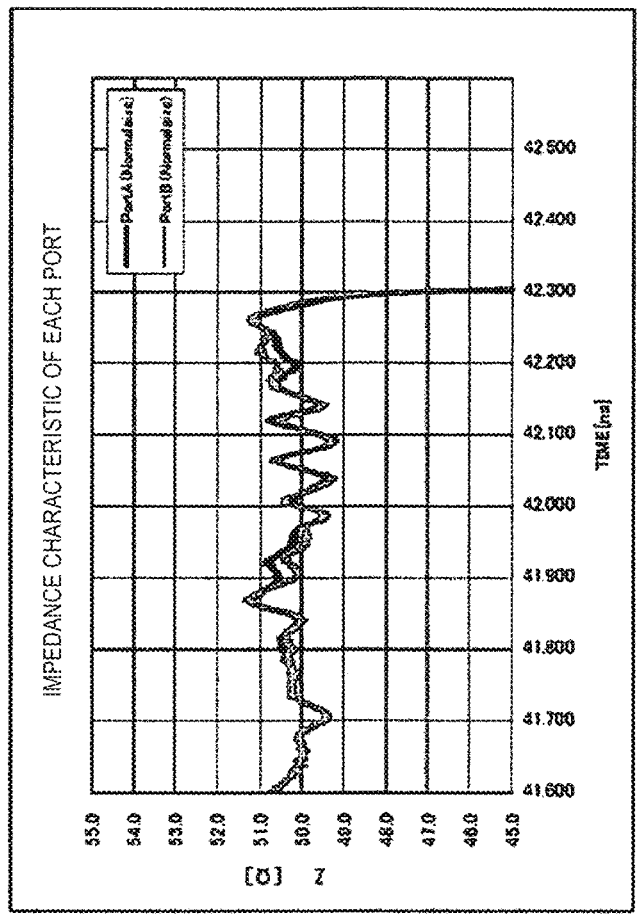
FIG. 20 is a diagram showing a measurement result of a characteristic impedance of the probe 10 in the fifth configuration example.

FIG. 20 is a diagram showing a measurement result of a characteristic impedance of the probe 10 in the fifth configuration example. The characteristic impedance of the probe 10 is measured according to a time domain reflection method (TDR method). An end of the probe 10 (an end portion of a connector 16 connected to the coaxial cable 3) is matched with a 50Ω resistance.

Figure 21:
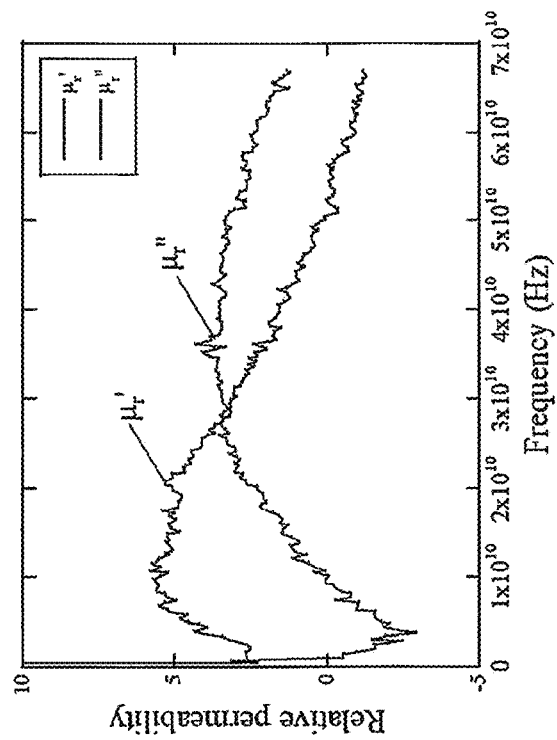
FIG. 21 is a graph of a measurement result of magnetic permeability by a magnetic permeability measuring device using the probe 10 in the fifth configuration example.

FIG. 21 is a graph of a measurement result of magnetic permeability by a magnetic permeability measuring device using the probe 10 in the fifth configuration example. A sample to be evaluated is a Ni-Ferrite thin film (8 mm×5 mm×1.2 µm in thickness), and a result was obtained in which complex magnetic permeability (µ=µ'−jµ") up to a high frequency band of about 67 Ghz can be measured at a high SN ratio.

A measurement procedure by the magnetic permeability measuring device provided with each probe 10 in the above-mentioned first to fifth configuration examples will be described below.

Figure 22:
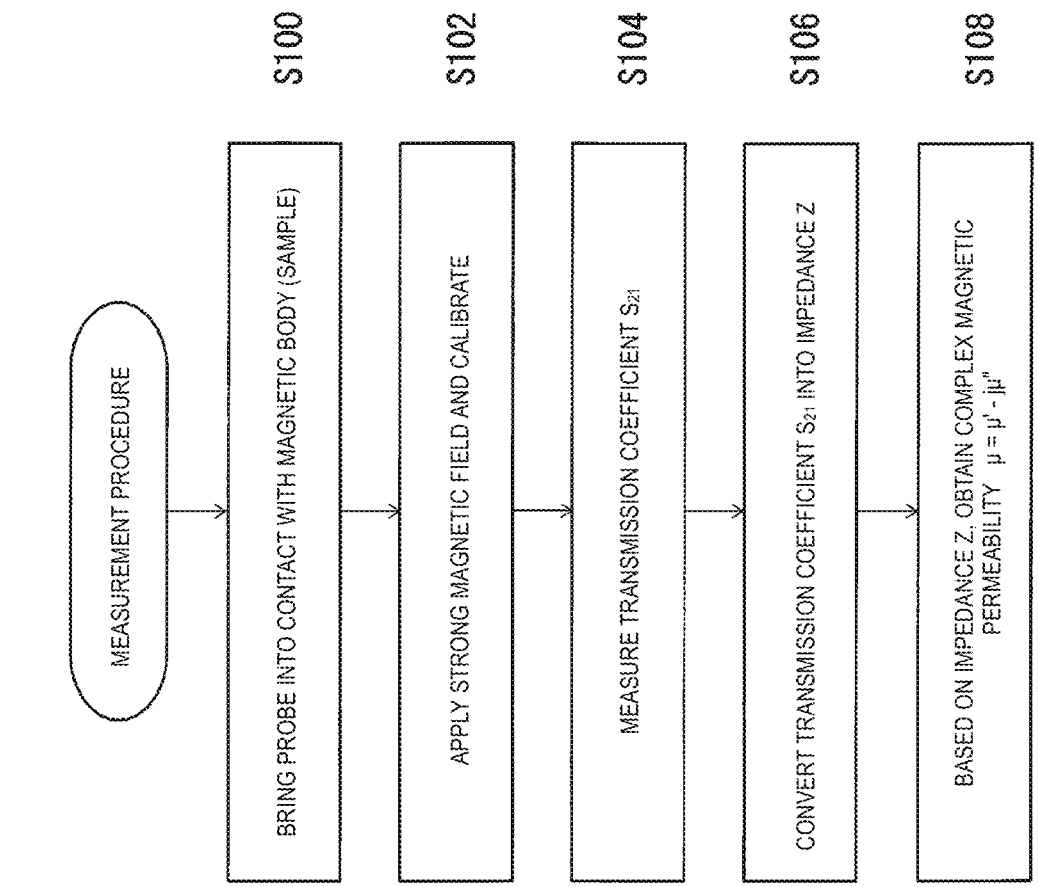
FIG. 22 is a flowchart showing a procedure of a magnetic permeability measuring method according to the embodiment of the invention.

FIG. 22 is a flowchart showing a procedure of a magnetic permeability measuring method according to the embodiment of the invention. The microstrip line 14 of the probe 10 is brought into contact with the magnetic body 1 to be evaluated (S100). Then, the magnetic body 1 is placed in a Helmholtz coil, a strong DC magnetic field (for example, about 20 kOe) is applied to saturate the magnetic body 1, and calibration is performed by the network analyzer 20 (S102). Accordingly, electrical lengths of the probe 10 and the coaxial cable 3, a DC impedance of the magnetic body, a non-magnetic signal, and the like are removed. Thereafter, the DC magnetic field is released, and a transmission coefficient ($S_{21}$) of contribution of the magnetic body 1 is measured (S104). The transmission coefficient ($S_{21}$) is converted into an impedance, Z, of the magnetic body 1 according to a following equation (1) (S106).

[Equation 1]

$$Z = 100 \frac{1 - S_{21}}{S_{21}} \quad (1)$$

Specifically, the transmission coefficient ($S_{21}$) depending on presence or absence of a permanent magnet for saturating the magnetic body 1 is measured by the network analyzer 20. A background is a time when the probe 10 is brought into contact with the magnetic body 1 and the permanent magnet (Helmholtz coil) is disposed in close proximity to saturate the magnetic body 1, and the transmission coefficient at this time is set as a reference signal. Next, the transmission coefficient when the permanent magnet is removed is measured. The transmission coefficient at this time is a difference signal from the reference signal, that is, a difference value between the transmission coefficients of both presence and absence of the permanent magnet, and this transmission coefficient reflects a magnetic characteristic of the magnetic body 1. The difference value between the transmission coefficients is an impedance component due to contribution of the magnetic body 1.

According to the equation (1), the impedance, Z, is a difference value between the transmission coefficients, a real part is a loss component (resistance component) R of the magnetic body 1, and an imaginary part is the inductance component L of the magnetic body 1. The inductance component L corresponds to the real part (μ') of the magnetic permeability of the magnetic body 1, and the resistance component R corresponds to the imaginary part (μ") of the magnetic permeability of the magnetic body 1. The magnetic permeability (complex magnetic permeability) μ of the magnetic body 1 is expressed according to a following equation (2).

[Equation 2]

$$\mu = \mu' - j\mu'' \quad (2)$$

Figure 23:
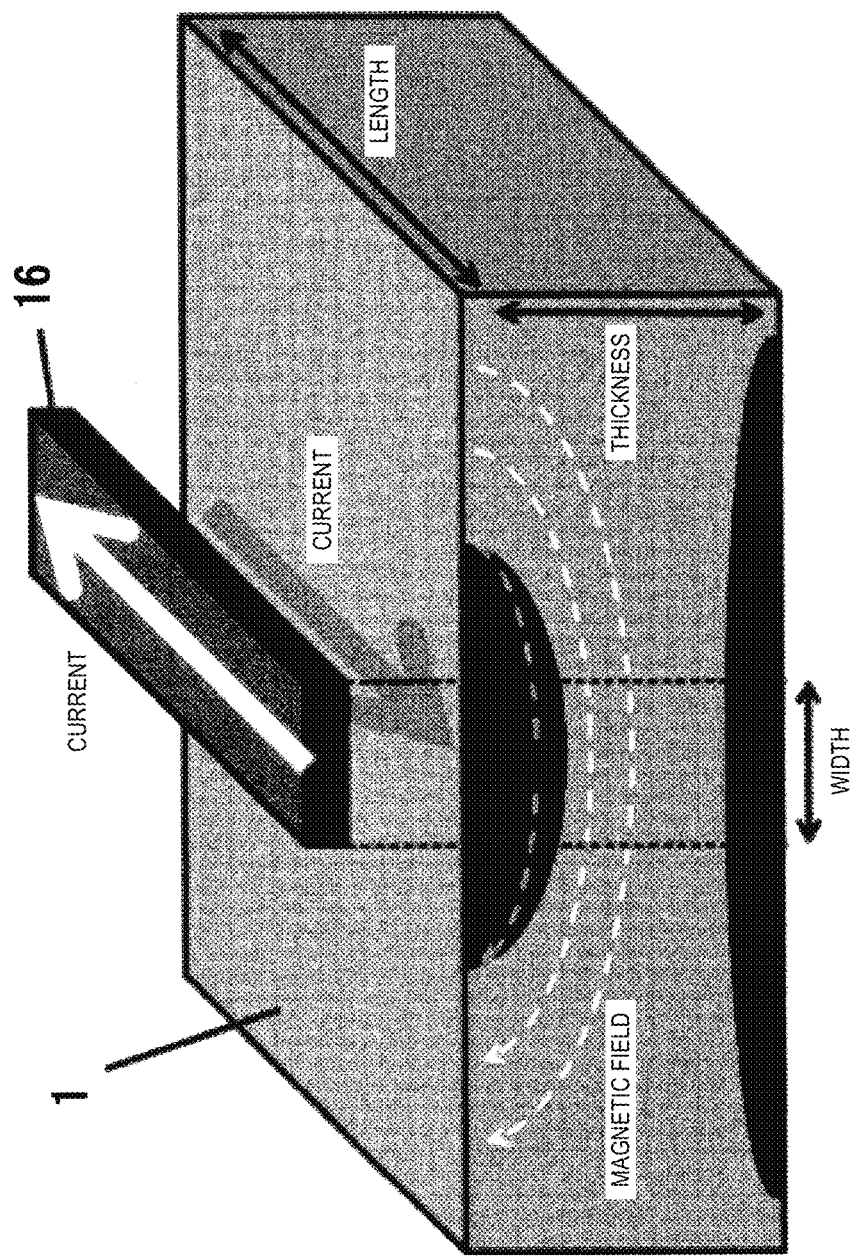
FIG. 23 is a diagram schematically showing a shape of a magnetic thin film as a magnetic body sample to be evaluated.

FIG. 23 is a diagram schematically showing a shape of a magnetic thin film as a magnetic body sample to be evaluated. The higher a frequency, the more current flows only on a surface of the film due to a skin effect. Assuming that the impedance, Z, is determined by biasing the current in a film thickness direction due to the skin effect as shown in FIG. 23, μ' and μ" are repeatedly calculated according to a Newton-Raphson method using, for example, the above equation (2) and following equations (3) and (4) as the numerical analysis processing, and the complex magnetic permeability is obtained by optimization processing such that a predetermined evaluation function value is minimized (S108).

[Equation 3]

$$Z = \frac{k\rho l}{2w} \coth\left(\frac{kt}{2}\right) \quad (3)$$

[Equation 4]

$$k = \frac{1+j}{\sqrt{\frac{\rho}{\pi f \mu}}} \quad (4)$$

Z is an impedance, ρ is resistivity, l is a sample length, w is a sample width, t is a film thickness, f is a frequency, and μ is complex magnetic permeability.

The invention is not limited to the above embodiment, and it is needless to say that design changes that do not depart from the scope of the invention including various modifications and corrections that can be conceived by a person having ordinary knowledge in the field of the invention are included in the invention.

REFERENCE SIGNS LIST

1 magnetic body (magnetic thin film)
3 coaxial cable
10 probe
12 transmission conductor
12*a* signal conductor
12*b* ground conductor
14 transmission conductor
14*a* signal conductor
14*b* ground conductor
16 linear conductor
17 microstrip line
17*a* microstrip conductor
18 connector
19 body
19*a* flat portion
20 network analyzer (signal measuring instrument)
30 calculation processing device

The invention claimed is:

1. A magnetic permeability measuring device configured to measure magnetic permeability of a magnetic body comprising:
   a probe;
   a magnetic field applying portion configured to apply a magnetic field to the magnetic body;
   a signal measuring instrument that is connected to the probe via a cable and that is configured to measure a signal of a transmission coefficient both presence and absence of magnetic field application by the magnetic field applying portion; and
   a processing unit configured to obtain, based on the signal of the transmission coefficient measured by the signal measuring instrument, magnetic permeability of the magnetic body by numerical analysis calculation processing,
   further, the probe including:
   a first signal conductor and a second signal conductor that form a pair of signal conductors, the first signal conductor and the second signal conductor being a signal transmission path transmitting a supplied current signal;
   a first ground conductor and a second ground conductor that form a pair of ground conductors disposed in the vicinity of the pair of signal conductors; and
   a linear conductor, wherein
   (i) the linear conductor electrically connects tip ends of the first signal conductor and the second signal conductor and extends between the tip ends, the tip ends of the first signal conductor and the second signal conductor are disposed away from a surface of the magnetic body by a predetermined gap length and at a predetermined interval from each other,
   the tip ends of the first ground conductor and the second ground conductor are in contact with the surface of the magnetic body, and
   the linear conductor is in parallel with the surface of the magnetic body and away from the surface of the magnetic body by the predetermined gap length, or
   (ii) the linear conductor electrically connects tip ends of the first ground conductor and the second ground conductor and that extends between the tip ends, the tip ends of the first signal conductor and the second signal conductor are in contact with the surface of the magnetic body and are disposed at a predetermined interval from each other, the tip ends of the first ground conductor and the second ground conductor are disposed away from the surface of the magnetic body by a predetermined gap length, and
   the linear conductor is in parallel with the surface of the magnetic body and away from the surface of the magnetic body by the predetermined gap length.

2. The magnetic permeability measuring device according to claim 1, wherein
the first signal conductor and the first ground conductor form a first coaxial line, and the second signal conductor and the second ground conductor form a second coaxial line.

3. The magnetic permeability measuring device according to claim 2, wherein
the linear conductor has a width smaller than diameters of the first coaxial line and the second coaxial line.

4. The magnetic permeability measuring device according to claim 1, wherein
the first signal conductor and the first ground conductor form a first coplanar line, and the second signal conductor and the second ground conductor form a second coplanar line.

5. The magnetic permeability measuring device according to claim 4, wherein
the linear conductor has a width equal to or smaller than a width of the first signal conductor and the second signal conductor.

6. The magnetic permeability measuring device according to claim 1, wherein
the first signal conductor and the first ground conductor form a first microstrip line, and the second signal conductor and the second ground conductor form a second microstrip line.

7. The magnetic permeability measuring device according to claim 6, wherein
the linear conductor has a width equal to or smaller than a width of the first signal conductor and the second signal conductor.

8. The probe according to claim 1, wherein the magnetic body is a magnetic thin film.

9. A probe configured to measure magnetic permeability of a magnetic body, the probe comprising:
a microstrip line that is a portion in contact with the magnetic body and that is formed by sandwiching a dielectric between a microstrip conductor and a ground conductor;
connectors each connected to a respective one of both ends of the microstrip line; and
a body that holds the microstrip line and the connectors, wherein
the body has a convex curved portion on a top portion of the body, and the microstrip line is curved along the convex curved portion straddling the top portion of the body, and
the connectors hold the microstrip line disposed on the convex curved portion at an opening angle of about 90 degrees.

10. The probe according to claim 9, wherein
a flat portion is provided at a top portion of the convex curved portion of the body, and a portion of the microstrip line along the flat portion is linearly disposed.

11. The probe according to claim 10, wherein
the connectors are attached to side surfaces extending downward from the top portion of the body.

12. The probe according to claim 9, wherein
the magnetic body is a magnetic thin film.

13. A magnetic permeability measuring device comprising:
the probe according to claim 9;
a magnetic field applying portion configured to apply a magnetic field to the magnetic body;
a signal measuring instrument that is connected to the probe via a cable and that is configured to measure a signal of a transmission coefficient both presence and absence of magnetic field application by the magnetic field applying portion; and
a processing unit configured to obtain, based on the signal of the transmission coefficient measured by the signal measuring instrument, magnetic permeability of the magnetic body by numerical analysis calculation processing.

* * * * *